United States Patent [19]
Balch et al.

[11] Patent Number: 5,969,659
[45] Date of Patent: Oct. 19, 1999

[54] ANALOG TO DIGITAL CONVERTERS WITH EXTENDED DYNAMIC RANGE

[75] Inventors: Brent F. Balch, Fort Lauderdale; Stephen W. Embling, Pompano Beach; Fadi Ayoub, Deerfield Beach; David Fallin, Coral Springs, all of Fla.

[73] Assignee: Sensormatic Electronics Corporation, Boca Raton, Fla.

[21] Appl. No.: 08/980,324

[22] Filed: Nov. 28, 1997

[51] Int. Cl.$^6$ ........................................... H03M 1/12
[52] U.S. Cl. ................................. 341/159; 341/155
[58] Field of Search ............................. 341/118, 120, 341/155, 158, 159

[56] References Cited

U.S. PATENT DOCUMENTS

| | | | |
|---|---|---|---|
| 4,527,152 | 7/1985 | Scarr et al. | 340/572 |
| 4,644,286 | 2/1987 | Torre | 329/50 |
| 4,658,241 | 4/1987 | Torre | 340/551 |
| 4,675,658 | 6/1987 | Anderson et al. | 340/551 |
| 4,924,225 | 5/1990 | Dingwall et al. | 341/118 |
| 4,963,880 | 10/1990 | Torre et al. | 343/866 |
| 5,023,600 | 6/1991 | Szklany et al. | 340/572 |
| 5,049,857 | 9/1991 | Plonsky et al. | 340/551 |
| 5,353,011 | 10/1994 | Wheeler et al. | 340/572 |
| 5,371,552 | 12/1994 | Brummette et al. | 341/118 |
| 5,396,168 | 3/1995 | Heep et al. | 324/115 |
| 5,495,229 | 2/1996 | Balch et al. | 340/551 |
| 5,640,693 | 6/1997 | Balch et al. | 455/127 |
| 5,661,481 | 8/1997 | Muramatsu | 341/120 |
| 5,736,949 | 4/1998 | Ong et al. | 341/141 |

*Primary Examiner*—Brian Young
*Assistant Examiner*—Pegoy JeanPierre
*Attorney, Agent, or Firm*—Quarles & Brady LLP

[57] ABSTRACT

An arrangement for improving the operation of an analog to digital converter (A/D), which can form part of an integrated circuit, the A/D converter being coupled to a reference voltage and having a plurality of input pins associated therewith comprises: a resistor divider having a plurality of resistors coupled in series, the resistor divider having an upper node coupled to a source of voltage to be converted, having a lower node coupled to a source of reference potential and having a plurality of intermediate nodes; and, each of the upper intermediate nodes being coupled to a respective one of the input pins of the A/D converter. The A/D converter can have enhanced resolution and/or an extended dynamic range when the voltage level being tested is divided arid the reference voltage is reduced. A corresponding method comprises the steps of: successively scaling down a voltage to be converted to a series of stepped down voltage levels; applying the successively stepped down voltage levels to respective ones of the input pins; and, sequentially scanning and acquiring a plurality of scaled A/D converter values from the input pins.

10 Claims, 1 Drawing Sheet

2

ANALOG TO DIGITAL CONVERTERS WITH EXTENDED DYNAMIC RANGE

BACKGROUND OF THE INVENTION

1. Field of the Invention

This invention relates to the field of analog to digital converters, and in particular, to an arrangement for extending the range of analog to digital (A/D) converters found in microprocessors and other integrated circuits.

2. Description of Related Art

Many microprocessor controller chips provide integral A/D converters to allow measurement of external circuit potentials. These integral A/D converters often have multiplexed inputs, so that readings from multiple sources can be acquired with a single software command. While economical, these on board A/D converters usually only provide 8 or 10 bits of resolution. If circuit demands either require higher resolution or an enhanced dynamic range, a much more costly external A/D converter must be provided.

External A/D converters can also have a similar structure, namely a plurality of input pins, which acquire their samples simultaneously, or if not simultaneously, within a very short time relative to the parameter being measured. For purposes of this application, the term simultaneously and the phrase within a very short time will be deemed to be encompassed by the phrase substantially simultaneously.

SUMMARY OF THE INVENTION

Many microprocessors now available provide on-board multiplexed input A/D converters with limited (8 or 10-bit) resolution, for example 8-bit or 10-bit. External A/D converters of a similar structure are also available. At the cost of giving up some of the additional inputs, and with the addition of some external circuitry, the dynamic range of these A/D converters can be extended, for example doubling the range for each additional input contributed.

Additional resistors and input protection circuits can be connected to the multiple inputs of the A/D converter, making it possible for the A/D converter to measure voltages above the reference voltage of the integrated circuit, and therefore above the reference level of the A/D converter.

The arrangement described herein provides for enhanced circuit function using available circuitry, with minimal additional circuit cost. Obtaining the same performance using conventional techniques would add approximately $15.00 in cost to the system.

These kinds of analog to digital converters work by comparing the voltage presented at an input pin with the voltage at the output of an internal digital to analog (D/A) converter. The digital to analog converter output is confined between a reference potential, usually ground, and an upper limit determined by an external voltage reference device connected to a voltage reference pin. By lowering the reference voltage and dividing the input, the resolution for the first two inputs has been increased.

An inventive arrangement for improving the operation of an analog to digital converter, the analog to digital converter being coupled to a reference voltage and having a plurality of input pins associated therewith, the arrangement comprises: a resistor divider having a plurality of resistors coupled in s series, the resistor divider having an upper node coupled to a source of voltage to be converted from analog to digital form, having a lower node coupled to a source of reference potential and having a plurality of intermediate nodes between the upper and lower nodes; and, each of the upper node and the intermediate nodes being coupled to a respective one of the plurality of input pins of the analog to digital converter, the voltage to be converted being thereby successively scaled down in magnitude at successive ones of the plurality of input pins.

The analog to digital converter can be internal to an integrated circuit or external.

Lowering the reference voltage level and dividing or scaling down the voltage to be converted increases the resolution for at least some of the taps of the digital to analog converter coupled to the voltage divider.

The voltage to be converted can also be scaled down by the resistor ladder to a range corresponding to the reference voltage, whereby the analog to digital converter has a dynamic range extended beyond the reference voltage.

A microprocessor can comprise a memory and a gating circuit for sequentially scanning and acquiring a plurality of scaled analog to digital converter values from the plurality of input pins.

The arrangement can further comprise respective current limiting resistors coupled in series between each of the plurality of input pins and the respective nodes.

The arrangement can also further comprising a voltage clamp coupled between at least one, and preferably most of the input pins and the source of reference potential.

In a presently preferred embodiment, that one of the plurality of resistors in the divider connected to the upper node has a first resistance and each of the remaining resistors in the divider has a second resistance approximately one-half that of the first resistance, whereby the voltage to be converted is scaled down by the divider in steps of one-half each preceding value.

A method in accordance with another inventive arrangement for improving the performance of an analog to digital converter, which can form part of an integrated circuit, the analog to digital converter being coupled to a reference voltage and having a plurality of input pins associated therewith, comprises the steps of: (a.) successively scaling down a voltage to be converted to a series of stepped down voltage levels, from a highest voltage level to a lowest voltage level; (b.) applying the successively stepped down voltage levels to respective ones of the plurality of input pins; and, (c.) sequentially scanning and acquiring a plurality of scaled analog to digital converter values from the plurality of input pins.

In a presently preferred embodiment, the method further comprises the step of (d.) scaling down the voltage in stepped down voltage levels successively reduced by a scale factor. In accordance with this embodiment, the method further comprises the steps of: (e.) comparing the voltage level at the input pin coupled to the highest voltage level to the reference voltage; (f.) if the highest voltage level is less than the reference voltage, accepting the highest voltage level as representing the voltage to be converted; (g.) if the highest voltage level is not less than the reference voltage, comparing the voltage level at the input pin coupled to the next lower voltage level; (h.) comparing the voltage level at the input pin coupled to the next lower voltage level to the reference voltage; (i.) if the next lower voltage level is less than the reference voltage, multiplying the next lower voltage level by the scale factor of the next lower voltage level and accepting the result of the multiplying as representing the voltage to be converted; and, (j.) if the next lower voltage level is not less than the reference voltage, repeating the steps (h.) and (i.) until a value has been accepted as representing the voltage to be converted or the next lower voltage levels at all of the pins have been compared to the reference voltage.

BRIEF DESCRIPTION OF THE DRAWINGS

The FIG. 1 shows an arrangement for extending the dynamic range, or resolution, of an A/D converter in an integrated circuit.

DETAILED DESCRIPTION OF THE PREFERRED EMBODIMENTS

Figure 1:
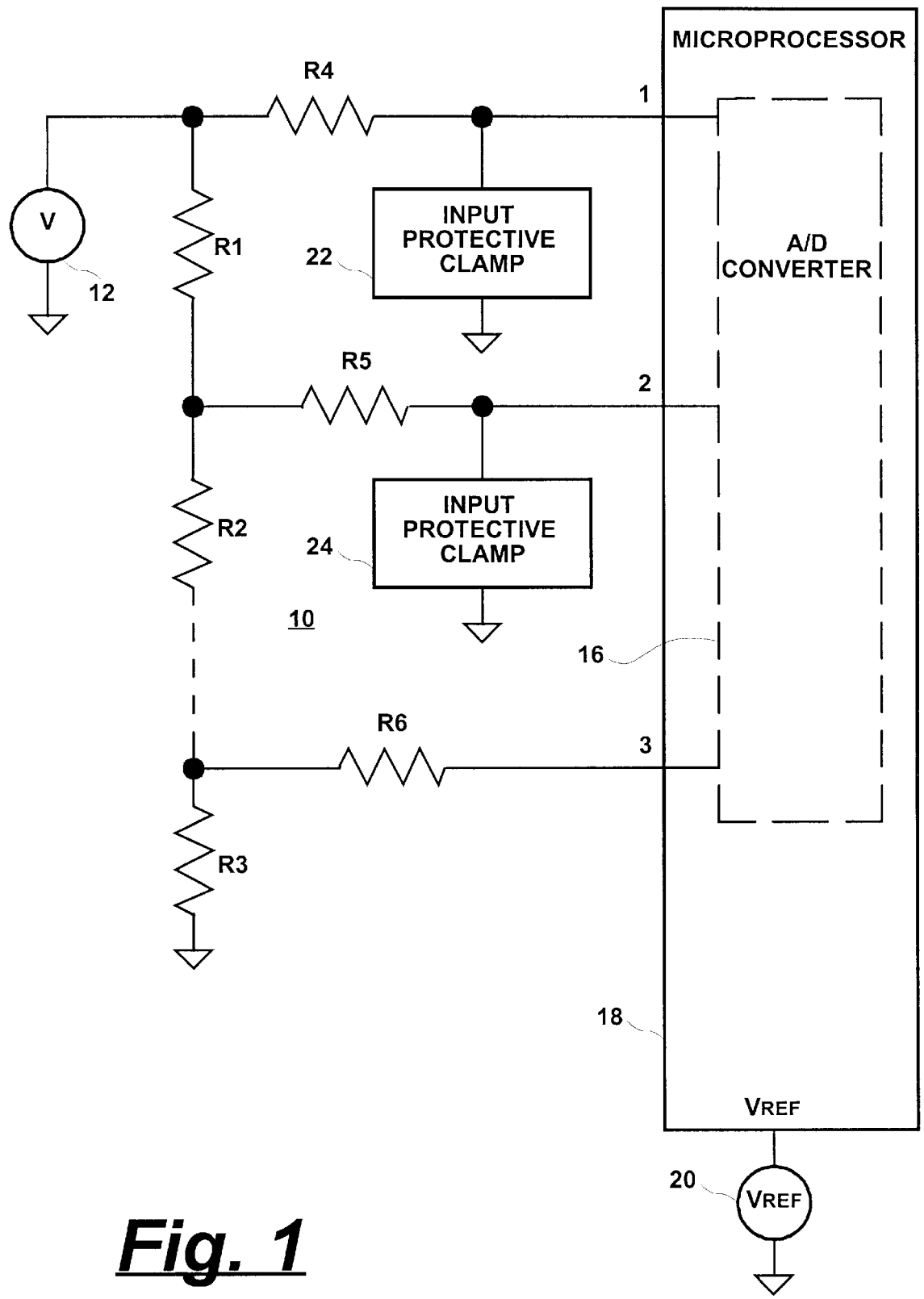

The circuit 10 shown in the FIGURE is an arrangement for extending the dynamic range, or resolution, of an A/D converter 16, which can form part of an integrated circuit 18 as shown, or which can be stand alone but of a similar structure to the kinds of A/D converters typically found in integrated circuits. The integrated circuit shown in the Figure is a microprocessor used to control the operation of an electronic article surveillance system, or other system. An example of such a microprocessor is the Motorola MC68HC16. The integrated circuit 18, or at least the A/D converter 16, has an adjustable reference voltage ($V_{REF}$) 20 coupled to a $V_{REF}$ input. The same would be true for a comparable stand-alone A/D converter.

A voltage V from voltage source 12 is applied to the multiple inputs of the A/D converter 16. Some of the multiple inputs are shown and designated pins 1, 2 and 3, through a network of resistors R1 through R6 and input protective clamps 22 and 24. The arrangement is illustrated with only three input pins of the A/D converter for purposes of clarity. It will be appreciated that the arrangement can be applied to additional inputs for enhancing the resolution and/or extending the dynamic range even further.

The voltage to be converted, and appearing at the pin 1 input is simultaneously applied to a voltage divider comprising resistors R1, R2 and R3, which attenuate the input signal and apply lower levels to the pin 2 and pin 3 inputs respectively. In a presently preferred embodiment, resistors R2 and R3 are equal in value and the value of resistor R1 is twice as large. In this case, the voltage at the pin 2 input is one-half that of the voltage at the pin 1 input, and the voltage at the pin 3 input is one-fourth that at the pin 1 input.

If the value of $V_{REF}$ is, for example, 2.50 volts DC, then any input of 2.5 V or more on any of the input pins will represent a full scale value for that input. Assume that some unknown voltage is applied by the voltage source at the time the microprocessor software issues a command to do a conversion. The microprocessor is typically designed such that if a single A/D convert command is given and executed, then several inputs are rapidly scanned in sequence and separate conversions done for each, which are subsequently stored in memory. For voltages up to the input clamp level, virtually no current flows in the clamp circuit, so the full potential appears at the pin 1 input. If the converted value for the pin 1 input is below full scale, the measurement is considered complete and the pin 1 input value is assigned to the unknown voltage.

If the converted value for the pin 1 input is at or very near full scale, then the software examines the converted value for the pin 2 input. Since the divider provides half the level at this tap, a value of 5.0 V at the voltage source will produce 2.5 V or full scale at this tap.

If the converted value for the pin 2 input is less than full scale, then the pin 2 input value is multiplied by 2 and this value is assigned to the unknown voltage. If the converted value for the pin 2 input is at or very near full scale, then the software examines the converted value for the pin 3 input.

Since the divider provides one fourth the level at this tap, a value of 10.0 V at the voltage source will produce 2.5 V or full scale at this tap. If the converted value for the pin 3 input is less than full scale, then the pin 3 input value is multiplied by 4 and this value is assigned to the unknown voltage. If the pin 3 input value is also full scale, and the pin 3 input is the last available input pin, then the voltage source value is assumed to be over range, that is greater than 10.0 V, and an error is signaled.

The input protective clamp circuits are provided to protect the microprocessor inputs from potentials in excess of design limits. As the voltage source output level increases, a point will be reached when the pin 1 input clamp 22 will start conducting current, generating a voltage drop across current limiting resistor R4. The clamps can comprise a biased diode, a Zener diode or other suitable circuitry. The actual voltage at the pin 1 input will not substantially increase beyond this point. Similarly, as the voltage source continues to increase, the pin 2 input clamp 24 will start conducting current, generating a voltage drop across current limiting resistor R5. A protective clamp is not usually necessary for the final input pin, in this example pin 3, because for a typical 5 V processor supply, the input voltage would have to exceed 20 V to damage this input.

The small currents into the inputs of the A/D converter combined with the small currents flowing in the input clamps can cause voltage drops across limiting resistors R4 and R5. For this reason, resistors R4 and R5 should be no larger than the value of resistor R1.

In summary, by scaling the voltage to be converted lower than the A/D supply voltage and reducing the reference voltage, the full range of the A/D converter spans a smaller overall voltage and the resolution of the converter, as measured for example in mV per step, has been enhanced. The A/D converter can read lower level voltages more accurately. At the same time, the voltage divider allows the A/D converter to read voltages actually above its supply range or reference voltage, representing an increase in dynamic range.

For example, assume an integrated circuit has an internal 10-bit digital to analog converter and a reference voltage level of 2.5 volts. A 10-bit A/D converter divides the reference voltage by 1024, resulting in 2.44 mV resolution for this example. However, if one needs to measure only 625 mV, for example, and arranges a three tap voltage divider across three of the A/D input pins as shown in the Figure, the 2.5 volt signal will be off scale for the first two taps, but the third input will be divided down to 625 mV. As a result, the apparent resolution is 625 mV divided by 1024, which equals 0.61 mV per step. The apparent 0.61 mV per step must be multiplied by the scaling factor, four in this example, which yields the 2.44 mV.

The penalty for this extended range is a successive loss in resolution, as also measured for example in mV per step, for each lower tap in the divider. This is usually acceptable, since higher level voltages do not usually need to be captured at maximum resolution.

The scale factor can be other than a constant reduction. Two alternatives are an octave scale factor and a logarithmic scale factor. In each of these cases, the corresponding software must be able to convert the scaled value back to the equivalent input value. Moreover, the divide ratio need not be the same for each step. The last pin, for example, might be a divide by 10 factor, so that out of range conditions never occur, notwithstanding the consequent loss of resolution. This also requires the corresponding software must be able to convert the scaled value back to the equivalent input value.

What is claimed is:

1. An arrangement for improving the operation of an analog to digital converter, said analog to digital converter being coupled to a reference voltage and having a plurality of input pins associated therewith, said arrangement comprising:

a resistor divider having a plurality of resistors coupled in series, said resistor divider having an upper node coupled to a source of voltage to be converted from analog to digital form, having a lower node coupled to a source of reference potential and having a plurality of intermediate nodes between said upper and lower nodes;

each of said upper node and said intermediate nodes being coupled to a respective one of said plurality of input pins of said analog to digital converter, said voltage to be converted being thereby successively scaled down in magnitude from a highest voltage level to a lowest voltage level at successive ones of said plurality of input pins; and, means for consecutively comparing said highest voltage level to said reference voltage level and depending on the comparison result, comparing the next lower voltage level to the reference voltage level, whereby if the next lower voltage level is less than the reference voltage, multiplying said next voltage level by a scale factor and taking the result as the voltage to be converted.

2. The arrangement of claim 1, wherein said reference voltage is reduced, whereby said analog to digital converter has enhanced resolution at least at one of said input pins.

3. The arrangement of claim 1, wherein said voltage to be converted is scaled down by said resistor divider to a range corresponding to said reference voltage, whereby said analog to digital converter has a dynamic range extended beyond said reference voltage.

4. The arrangement of claim 1, wherein that one of said plurality of resistors in said divider connected to said upper node has a first resistance and each of said remaining resistors in said divider has a second resistance approximately one-half that of said first resistance, whereby said voltage to be converted is scaled down by said divider in steps of one-half each preceding value.

5. A method for improving the performance of an analog to digital converter, said analog to digital converter being coupled to a reference voltage and having a plurality of input pins associated therewith, comprising the steps of:

(a) successively scaling down a voltage to be converted to a series of stepped down voltage levels, from a highest voltage level to a lowest voltage level;

(b) applying said successively stepped down voltage levels to respective ones of said plurality of input pins;

(c) sequentially scanning and acquiring a plurality of scaled analog to digital converter values from said plurality of input pins;

(d) scaling down said voltage in stepped down voltage levels successively reduced by a scale factor;

(e) comparing said voltage level at said input pin coupled to said highest voltage level to said reference voltage;

(f) if said highest voltage level is less than said reference voltage, accepting said highest voltage level as representing said voltage to be converted;

(g) if said highest voltage level is not less than said reference voltage, comparing said voltage level at said input pin coupled to said next lower voltage level;

(h) comparing said voltage level at said input pin coupled to said next lower voltage level to said reference voltage;

(i) if said next lower voltage level is less than said reference voltage, multiplying said next lower voltage level by said scale factor of said next lower voltage level and accepting the result of said multiplying as representing said voltage to be converted; and, (j) if said next lower voltage level is not less than said reference voltage, repeating said steps (h) and (i) until a value has been accepted as representing said voltage to be converted or said next lower voltage levels at all of said pins have been compared to said reference voltage.

6. The method of claim 5 wherein said A/D converter forms part of an integrated circuit.

7. The method of claim 5 wherein said A/D converter forms part of a microprocessor.

8. A method for improving the performance of an analog to digital converter, said analog to digital converter being coupled to a reference voltage and having a plurality of input pins associated therewith, comprising the steps of:

(a) successively scaling down a voltage to be converted to a series of stepped down voltage levels, from a highest voltage level to a lowest voltage level;

(b) applying said successively stepped down voltage levels to respective ones of said plurality of input pins;

(c) sequentially scanning and acquiring a plurality of scaled analog to digital converter values from said plurality of input pins;

(d) reducing said reference voltage;

(e) scaling down said voltage in stepped down voltage levels successively reduced by a scale factor;

(f) comparing said voltage level at said input pin coupled to said highest voltage level to said reference voltage;

(g) if said highest voltage level is less then said reference voltage, accepting said higher voltage level as representing said voltage to be converted;

(h) if said highest voltage level is not less than said reference voltage, comparing said voltage level at said input pin coupled to said next lower voltage level;

(i) comparing said voltage level at said input pin coupled to said next lower voltage level to said reference voltage;

(j) if said next lower voltage level is less than said reference voltage, multiplying said next lower voltage level by said scale factor of said next lower voltage level and accepting the result of said multiplying as representing said voltage to be converted; and, (k) if said next lower voltage level is not less than said reference voltage, repeating said steps (h.) and (i.) until a value has been accepted as representing said voltage to be converted or said next lower voltage levels at all of said pins have been compared to said reference voltage.

9. The method of claim 8 wherein said A/D converter forms part of an integrated circuit.

10. The method of claim 8 wherein said A/D converter forms part of a microprocessor.

* * * * *